(12) United States Patent
Tada

(10) Patent No.: US 10,615,339 B2
(45) Date of Patent: Apr. 7, 2020

(54) VARIABLE RESISTANCE ELEMENT AND METHOD FOR FABRICATING THE VARIABLE RESISTANCE ELEMENT

(71) Applicant: NEC Corporation, Minato-ku, Tokyo (JP)

(72) Inventor: Munehiro Tada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/086,695

(22) PCT Filed: Mar. 23, 2017

(86) PCT No.: PCT/JP2017/011792
§ 371 (c)(1),
(2) Date: Sep. 20, 2018

(87) PCT Pub. No.: WO2017/170149
PCT Pub. Date: Oct. 5, 2017

(65) Prior Publication Data
US 2019/0074437 A1    Mar. 7, 2019

(30) Foreign Application Priority Data
Mar. 30, 2016  (JP) ................................. 2016-067159

(51) Int. Cl.
*H01L 45/00*  (2006.01)
(52) U.S. Cl.
CPC ........ *H01L 45/1266* (2013.01); *H01L 45/085* (2013.01); *H01L 45/1206* (2013.01); *H01L 45/146* (2013.01); *H01L 45/1691* (2013.01)
(58) Field of Classification Search
CPC .. H01L 45/146; H01L 45/1691; H01L 45/085
See application file for complete search history.

(56) References Cited

U.S. PATENT DOCUMENTS

| 5,687,112 A | 11/1997 | Ovshinsky |
| 7,425,720 B2 | 9/2008 | Kaeriyama et al. |
| (Continued) | | |

FOREIGN PATENT DOCUMENTS

| JP | 2000-509204 A | 7/2000 |
| JP | 2005-101535 A | 4/2005 |
| (Continued) | | |

OTHER PUBLICATIONS

International Search Report dated May 30, 2017 in counterpart international application No. PCT/JP2017/011792, English translation.

(Continued)

*Primary Examiner* — Trang Q Tran

(57) ABSTRACT

To stabilize programming operation and to reduce leakage current. A variable resistance element according to the present invention is provided with: an interlayer insulating film; a first electrode that is formed within the interlayer insulating film and comprises an active electrode, the side surface and the bottom surface of which are covered by a barrier metal; a variable resistance film that is formed on the upper surface of the first electrode; a second electrode that is formed on the variable resistance film; and an insulating film spacer that is formed between the variable resistance film and the barrier metal which covers the side surface of the first electrode. In this connection, the variable resistance film and the barrier metal which covers the side surface of the first electrode are in contact with the insulating film spacer, respectively.

13 Claims, 10 Drawing Sheets

(56) References Cited

U.S. PATENT DOCUMENTS

| | | | | |
|---|---|---|---|---|
| 2010/0264394 A1* | 10/2010 | Aozasa | ............... | H01L 27/101 257/2 |
| 2013/0009128 A1* | 1/2013 | Ribeiro | ............. | H01L 27/2463 257/9 |
| 2013/0082231 A1 | 4/2013 | Tada et al. | | |
| 2015/0103583 A1 | 4/2015 | Tada et al. | | |

FOREIGN PATENT DOCUMENTS

| | | |
|---|---|---|
| JP | 2010-62265 A | 3/2010 |
| WO | 2011/158821 A1 | 12/2011 |
| WO | 2013/136798 A1 | 9/2013 |

OTHER PUBLICATIONS

Written Opinion dated May 30, 2017 in counterpart international application No. PCT/JP2017/011792, English translation.
Kaeriyama et al., "A Nonvolatile Programmable Solid-Electrolyte Nanometer Switch", IEEE Journal of Solid-State Circuits, vol. 40, No. 1, Jan. 2005, pp. 168-176.

* cited by examiner

VARIABLE RESISTANCE ELEMENT AND METHOD FOR FABRICATING THE VARIABLE RESISTANCE ELEMENT

This application is a National Stage Entry of PCT/JP2017/011792 filed on Mar. 23, 2017, which claims priority from Japanese Patent Application 2016-067159 filed on Mar. 30, 2016, the contents of all of which are incorporated herein by reference, in their entirety.

TECHNICAL FIELD

The present invention relates to a variable resistance element and a method for fabricating the variable resistance element.

BACKGROUND ART

In a semiconductor device (specifically, a silicon device), by miniaturization (scaling law: Moore's law), integration, power reduction, and the like are advancing at a rate of approximately four times per three years. In recent years, a technology node of a Metal Oxide Semiconductor Field Effect Transistor (MOSFET) has been equal to or smaller than 14 nm, and a lithography process faces a soaring cost (e.g. an apparatus cost and a mask set price), and therewith, a Non-Recurring Cost (NRE) is also increasing. Further, device dimensions are approaching a physical limit (operation limit/variation limit), and high performance of a semiconductor device and high profitability of a semiconductor business are demanded through an approach different from the conventional scaling law.

Among semiconductor devices, as a semiconductor device intermediately positioned between a gate array and a standard cell, a rewritable programmable logic device referred to as a Field Programmable Gate Array (FPGA) has been developed. An FPGA is a semiconductor device settable as any circuit configuration by a user him/herself after fabrication of a chip. Specifically, since an FPGA includes a memory, a user him/herself can optionally connect wirings electrically after fabrication of a semiconductor device. By using a semiconductor device mounted with such an FPGA, a degree of freedom of a circuit can be increased.

In recent years, a chip in which a variable resistance element is used for a memory and a switch of an FPGA has been developed. Examples of such a variable resistance element includes a Resistance Random Access Memory (ReRAM) using a transition metal oxide, a solid electrolyte switch using an ion conductor, an atomic switch, a Nano-Bridge (Registered Trademark), and the like.

Patent Literature 1 (PTL1) and Non-Patent Literature 1 (NPL1) disclose a configuration, an operation, and a cross-bar switch of a two-terminal-type switching element in which two electrodes are disposed via an ion conductor and a conduction state between the two electrodes is controlled.

NPL1 discloses a switching element using migration of metallic ions in an ion conductor and electrochemical reaction. Herein, the ion conductor refers to a conductor in which a carrier is ions and ions in an inside can freely move when an electric field or the like is applied from an outside.

The switching element described in NPL1 has a structure in which two electrodes of a first electrode and a second electrode sandwich a solid electrolyte. Of the two electrodes, the first electrode supplies metallic ions to the solid electrolyte. On the other hand, the second electrode does not supply metallic ions to the solid electrolyte.

Herein, an operation of the switching element described in NPL1 is described.

First, an operation in which the switching element described in NPL1 makes transition from an off-state (high resistance state) to an on-state (low resistance state) is described. In the switching element described in NPL1, when a first electrode is applied with positive voltage while a second electrode is grounded, metal configuring the first electrode is changed to metallic ions and dissolved in a solid electrolyte. Then, the metallic ions are deposited as metal in the sold electrolyte, and a metallic bridge (referred to also as a filament or a conductive path) that electrically connects the first electrode and the second electrode is formed. In other words, the first electrode and the second electrode are electrically connected by a metallic bridge, and thereby the switching element described in NPL1 makes transition from an off-state to an on-state.

In order to cause a switching element to make transition from an on-state to an off-state, a second electrode is applied with positive voltage while a first electrode is grounded. Thereby, a part of a metallic bridge formed in a solid electrolyte is disconnected. Therefore, electric connection between the first electrode and the second electrode is cut off, and therefore the switching element makes transition from an on-state to an off-state. At that time, while an electric characteristic is changed such that an electric resistance between the first electrode and the second electrode is increased or an inter-electrode capacitance is changed from a stage before transition from an on-state to an off-state, the switching element makes transition from an on-state to an off-state. Note that the switching element makes transition again from an off-state to an on-state by applying positive voltage to the first electrode while the second electrode is grounded after electric connection between the first electrode and the second electrode is cut off.

A switching element as described in NPL1 has a feature that a size thereof is smaller than a size of a semiconductor switch (a MOSFET or the like) and an on-resistance (a resistance value in an on-state) is small. Therefore, such a switching element has been thought to be promising for application to a programmable logic device. Further, this switching element maintains a conduction state (on-state) even without being applied with voltage and therefore may be thought to be applied to a non-volatile memory element.

When a switching element is applied to a non-volatile memory, it is conceivable that, for example, a memory cell including one switching element and one selection element such as a transistor is handled as a basic unit. Then, a plurality of these memory cells are arrayed on a substrate in a vertical direction and a lateral direction, respectively, and the memory cells are connected with a word line and a bit line. Memory cells are arrayed in this way, and thereby the word line and the bit line enable any memory cell to be selected from a plurality of memory cells. Thereby, a conduction state of a switching element of the selected memory cell is read, and thereby a non-volatile memory capable of reading any one of pieces of information "1" or "0" according to an on-state or an off-state being stored can be realized.

Patent Literature 2 (PTL2) discloses a variable resistance element in which an electric field concentration effect is generated by forming an electrode shape of a first electrode into a corner shape and thereby program voltage can be reduced and a variation is reduced by stabilizing a position of a metallic bridge deposited from the first electrode.

CITATION LIST

Patent Literature

[PTL1] Japanese Laid-open Patent Application No. 2005-101535
[PTL2] WO2013/136798

Non Patent Literature

[NPL1] Shunichi Kaeriyama et al., "A Nonvolatile Programmable Solid-Electrolyte Nanometer Switch", IEEE Journal of Solid-State Circuits, Vol. 40, No. 1, pp. 168-176, January 2005

SUMMARY OF INVENTION

Technical Problem

In the variable resistance element of PTL2, leakage current during an off-state depends on an electrode area. However, the variable resistance element of PTL2 has a problem that, when a variable resistance film is formed at an end of copper wiring, leakage current from a wiring side surface is generated, and therefore it is difficult to reduce leakage current while a program characteristic is maintained.

An object of the present invention is to provide a variable resistance element in which a programming operation is stabilized and leakage current is reduced, and a method for fabricating a variable resistance element.

Solution to Problem

A variable resistance element according to an aspect of the present invention, comprises:
an interlayer insulating film;
a first electrode that is formed in an inside of the interlayer insulating film and includes an active electrode a side surface and a bottom surface of which are covered with a barrier metal;
a variable resistance film that is formed on an upper surface of the first electrode;
a second electrode that is formed on the variable resistance film; and
an insulating film spacer that is formed between the barrier metal that covers a side surface of the first electrode and the variable resistance film, wherein
the barrier metal that covers a side surface of the first electrode and the variable resistance film is in contact with the insulating film spacer, respectively.

A method for fabricating a variable resistance element according to the other aspect of the present invention, the method comprises:
forming an interlayer insulating film;
forming a first electrode that includes an active electrode a side surface and a bottom surface of which are formed with a barrier metal layer in such a way that an upper surface is exposed to an inside of the interlayer insulating film;
forming an insulating barrier film on upper surfaces of the interlayer insulating film and the first electrode;
forming an opening that causes at least an end of the upper surface of the first electrode to be exposed to the insulating barrier film;
forming an opening in the interlayer insulating film and forming an insulating film spacer adjacent to the barrier metal layer formed on the side surface of the first electrode;
forming a variable resistance film on an upper surface of the end of the first electrode; and
forming a second electrode on the variable resistance film.

Advantageous Effect of Invention

According to the present invention, it is possible to provide a variable resistance element in which a programming operation is stabilized and leakage current is reduced.

EXAMPLE EMBODIMENT

Before the present invention is described in detail, in order to ease understanding of the present invention, a basic operation principle and terms of a variable resistance element are described.

A variable resistance element includes two types that are a unipolar-type variable resistance element and a bipolar-type variable resistance element.

The unipolar-type variable resistance element is a switching element that switches a high resistance state (off-state) and a low resistance state (on-state) by using applied voltage. As a unipolar-type variable resistance element, for example, a ReRAM is usable.

The bipolar-type variable resistance element is a switching element that switches a high resistance state and a low resistance state according to a polarity of applied voltage. As a bipolar-type variable resistance element, for example, a ReRAM and a NanoBridge (Registered Trademark) are usable.

Herein, with reference to FIG. 1, a bipolar-type variable resistance element is specifically described. FIG. 1 is a graph illustrating a current-voltage characteristic of a bipolar-type variable resistance element. Herein, a current-voltage characteristic in which a configuration of a bipolar-type variable resistance element is similar to a configuration of a unipolar-type variable resistance element is illustrated.

Figure 1A:
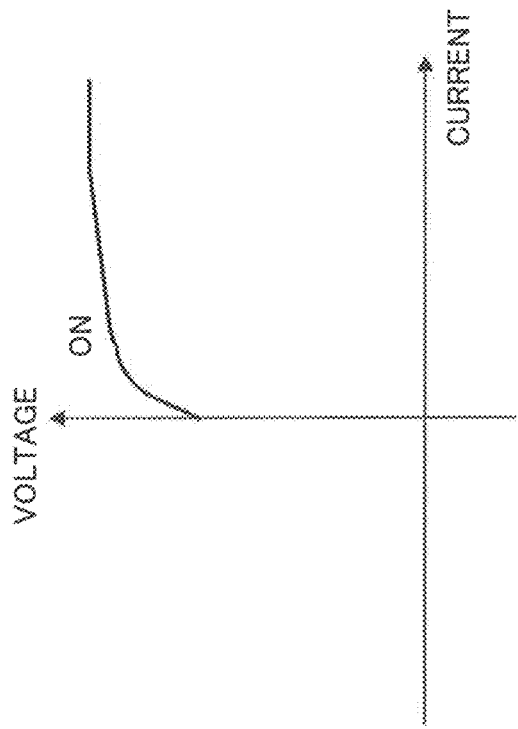
FIGS. 1A to 1D are graphs illustrating operation characteristics of a bipolar-type variable resistance element.

FIG. 1A illustrates a current-voltage characteristic in which when a bipolar-type variable resistance element is in an off-state, a first electrode is applied with positive voltage. As illustrated in FIG. 1A, when the first electrode is applied with positive voltage, the bipolar-type variable resistance element makes transition from an off-state to an on-state when the applied voltage exceeds a desired set voltage (threshold voltage).

Figure 1B:
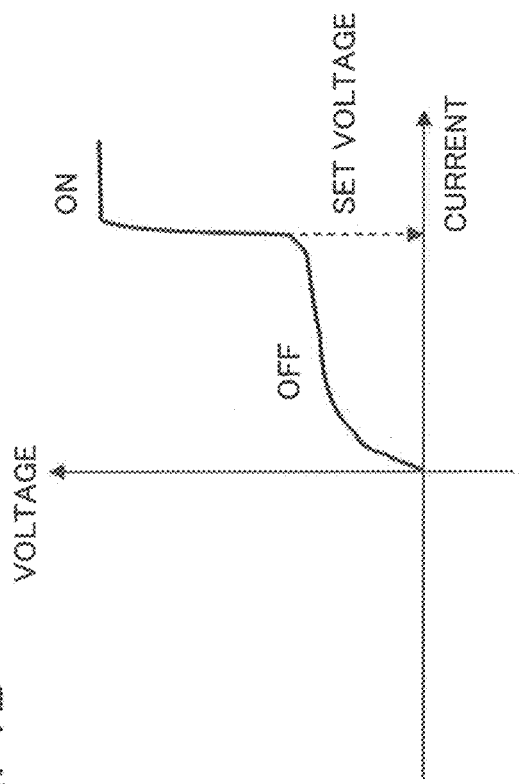

FIG. 1B illustrates a current-voltage characteristic in which when a bipolar-type variable resistance element is in an on-state, a first electrode is applied with positive voltage. As illustrated in FIG. 1B, when the first electrode is applied with positive voltage during an on-state, the bipolar-type variable resistance element indicates an ohmic current-voltage characteristic with maintaining the on-state.

Figure 1C:
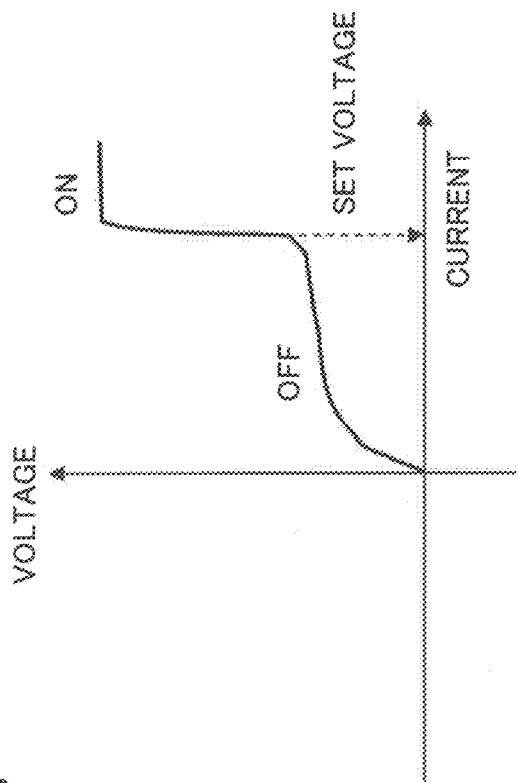

FIG. 1C illustrates a current-voltage characteristic in which when a bipolar-type variable resistance element is in an on-state, a first electrode is applied with negative voltage. As illustrated in FIG. 1C, when the first electrode is applied with negative voltage during an on-state, the bipolar-type variable resistance element makes transition from an on-state to an off-state when a desired reset voltage (threshold voltage) is exceeded.

Figure 1D:
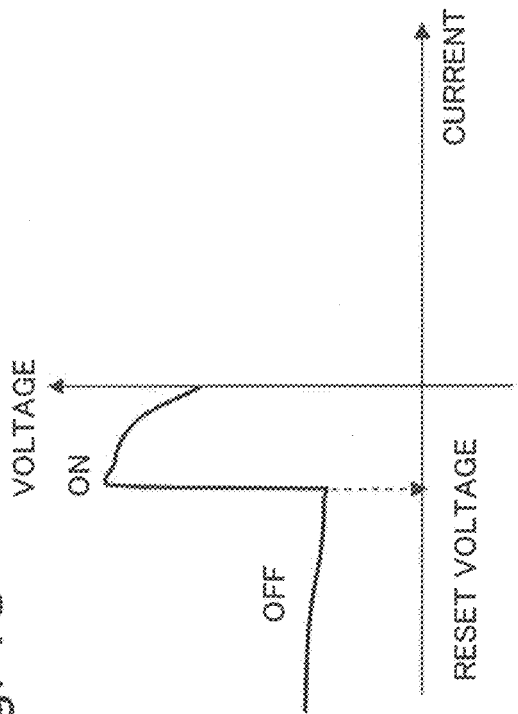

FIG. 1D illustrates a current-voltage characteristic in which after a bipolar-type variable resistance element makes transition from an on-state to an off-state, a first electrode is applied with positive voltage. As illustrated in FIG. 1D, when the first electrode is applied with positive voltage during an off-state, the bipolar-type variable resistance element makes transition from an off-state to an on-state when a desired set voltage (threshold voltage) is exceeded.

As described above, a bipolar-type variable resistance element makes transition from an off-state to an on-state when only positive voltage is applied to a first electrode and makes transition from an on-state to an off-state when only negative voltage is applied to the first electrode.

Herein, an electrode used in a bipolar-type variable resistance element is defined as follows.

As described with reference to FIG. 1A to FIG. 1D, of two electrodes included in a bipolar-type variable resistance element, an electrode in which the bipolar-type variable resistance element makes transition from an off-state to an on-state when positive voltage is applied is defined as a "first electrode" or an "active electrode". On the other hand, an electrode in which the bipolar-type variable resistance element makes transition from an on-state to an off-state when positive voltage is applied is defined as a "second electrode" or an "inactive electrode".

First Example Embodiment

Figure 2A:
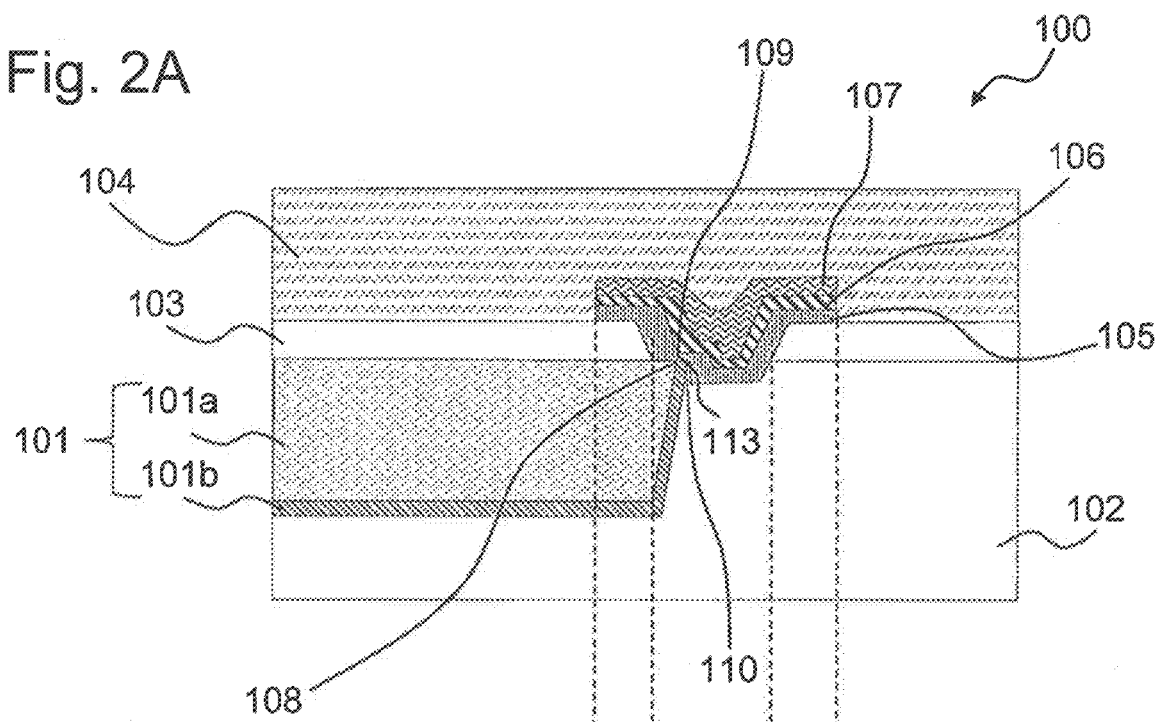
FIGS. 2A and 2B are schematic views illustrating structures of a cross-section and an upper surface of a variable resistance element according to a first example embodiment of the present invention.
Figure 2B:
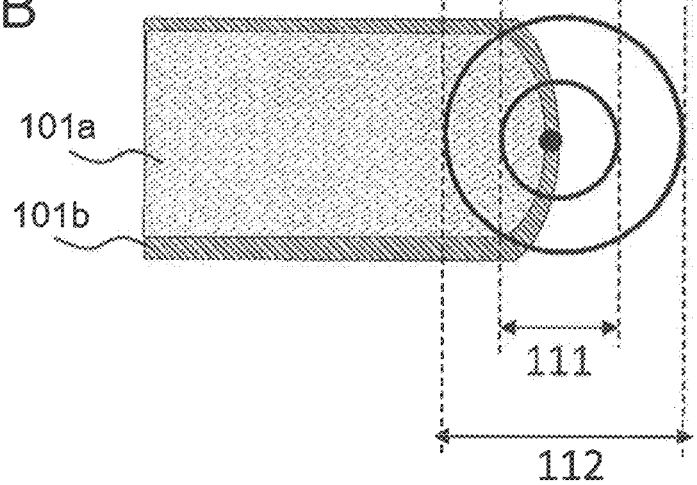

With reference to FIG. 2, a structure of a variable resistance element according to a first example embodiment of the present invention will be described. FIG. 2A is a schematic view of a cross-section of the variable resistance element according to the present example embodiment, and FIG. 2B is a schematic view of an upper surface of the variable resistance element according to the present example embodiment.

A variable resistance element 100 includes a first electrode 101, a first interlayer insulating film 102, an insulating barrier film 103, a second interlayer insulating film 104, a variable resistance film 105, a second electrode 106, an upper electrode 107, a first electrode acute angle point 108, a second electrode acute angle point 109, and an insulating film spacer 110.

The first electrode 101 is formed in an inside of the first interlayer insulating film, and includes an active electrode that supplies metallic ions to the variable resistance film 105 and is formed in an inside of the first interlayer insulating film. In the present example embodiment, the first electrode 101 includes copper wiring 101a configured by copper. In other words, the first electrode 101 supplies copper ions to the variable resistance film 105. Further, a side surface and a bottom surface of the copper wiring 101a are covered with a barrier metal layer 101b. Herein, the barrier metal layer 101b is a conductive film that prevents copper ions from being diffused into an inside of the variable resistance element 100. Specifically, the barrier metal layer 101b is a conductive film including, for example, a refractory metal such as Ta (tantalum), TaN (tantalum nitride) that is a nitride of Ta, TiN (titanium nitride), and WCN (tungsten carbonitride) or the like. Further, the barrier metal layer 101b may be a laminated film in which a conductive film including Ta, TaN, TiN, WCN or the like is laminated. Note that, in the present example embodiment, the copper wiring 101a in the first electrode 101 also functions as wiring of the variable resistance element 100.

The first interlayer insulating film 102 is an insulating film formed on a semiconductor substrate (not illustrated). As the first interlayer insulating film 102, for example, a silicon oxide film and a low-permittivity film (for example, an SiOCH film) or the like having a lower specific permittivity than in a silicon oxide film or the like are usable. Further, the first interlayer insulating film 102 may be a laminated film in which a silicon oxide film or a low-permittivity film or the like having a lower specific permittivity than in a silicon oxide film or the like is laminated. Further, the first interlayer insulating film 102 includes an opening of an inverse tapered shape in a thickness direction from a vertically upper side. While being specifically described later, when an opening of an inverse tapered shape is formed in the first interlayer insulating film 102, the insulating film spacer 110 can be formed between a lateral side of the barrier metal layer 101b and the variable resistance film 105. Note that, in example embodiments of the present invention, as a semiconductor substrate, for example, a silicon substrate, a single-crystal substrate, a Silicon On Insulator (SOI) substrate, a Thin Film Transistor (TFT) substrate, a substrate used for fabricating liquid crystal display or the like are usable.

The insulating barrier film 103 is an insulating film formed on an upper surface of the copper wiring 101a and an upper surface of the first interlayer insulating film 102. The insulating barrier film 103 prevents copper ions included in the copper wiring 101a from being diffused into the variable resistance element 100. As such an insulating barrier film 103, for example, a SiN (silicon nitride) film, a SiC (silicon carbide) film, a SiCN (silicon carbonitride) film or the like are usable. Further, the insulating barrier film 103 may be a laminated film in which a SiN film, a SiC film, a SiCN film or the like are laminated. Further, the insulating barrier film 103 includes an opening 111 of an inverse tapered shape in a thickness direction from a vertically upper side. Note that the opening 111 is formed in such a way that upper surfaces of the copper wiring 101a and the barrier metal layer 101b are exposed.

The second interlayer insulating film 104 is an insulating film formed on an upper surface of the insulating barrier film 103. As the second interlayer insulating film 104, similarly to the first interlayer insulating film 102, for example, a silicon oxide film, a low-permittivity film or the like having a lower specific permittivity than in a silicon oxide film are usable. Further, the second interlayer insulating film 104 may be a laminated film in which a silicon oxide film, a low-permittivity film or the like having a lower specific permittivity than in a silicon oxide film is laminated.

The variable resistance film 105 is a variable resistance film formed along a wall surface of an opening formed in the first interlayer insulating film 102 and a wall surface of the opening 111 formed in the insulating barrier film 103. Therefore, the variable resistance film 105 is electrically connected to the copper wiring 101a and the barrier metal layer 101b at inside the opening 111. In the present example embodiment, as the variable resistance film 105, for example, a solid electrolyte is usable. Herein, the solid electrolyte may include an oxide, an organic material, a sulfide or the like. Specifically, as the variable resistance film 105, an oxide insulating film including Ta such as a $Ta_2O_5$ (tantalum pentoxide) film and a TaSiO film is usable. Further, the variable resistance film 105 may be a laminated film in which, for example, a $Ta_2O_5$ film and a TaSiO film are laminated in this order. Further, the variable resistance film 105 may be a laminated film in which a polymer film in which a main component is CH, a polymer film including a small amount of SiO (silicon oxide), and a film including a sulfide such as $Cu_2S$ (copper sulfide) and GeS (germanium sulfide) and an oxide are laminated. Note that, in the present example embodiment, the variable resistance element 100 is not limited to a solid electrolyte or may be another variable resistance element.

The second electrode 106 is an electrode formed on the variable resistance film 105. The second electrode 106 includes an electrode shape 112 having a wider width than the opening 111. Further, the second electrode 106 is preferably formed with a material inactive to movable ions included in the first electrode 101. In the present example embodiment, the second electrode 106 preferably includes metal less likely to be ionized than copper included in the first electrode 101 and less likely to be diffused and be ion-conductive in the variable resistance film 105. Specifically, as the second electrode 106, a metal material in which an absolute value of free energy of oxidation is smaller than in copper included in a first electrode is preferably used. As such a metal material, for example, a noble metal-based material such as Ru (ruthenium) and Pt (platinum) can be cited. Note that, in the present example embodiment, the second electrode 106 includes at least Ru, nitrogen, and a first metal. Herein, as the first metal, metal in which a free energy of oxidation is larger in a negative side than in copper included in a first electrode is preferably used. Specifically, the first metal preferably includes at least one of, for example, Ti, Ta, Al (aluminum), Mn (manganese), Zr (zirconium), Hf (hafnium), Mg (magnesium), Co (cobalt), Zn (zinc), or W (tungsten).

The upper electrode 107 is an electrode formed on the second electrode 106. The upper electrode 107 includes an electrode shape 112 having a wider width than the opening 111, similarly to the second electrode 106. Further, the upper electrode 107 protects the second electrode 106 from etching or the like when the variable resistance element 100 is produced. As such an upper electrode 107, for example, Ta, Ti, TaN, TiN or the like are usable.

The first electrode acute angle point 108 is an acute angle portion in an upper surface of the copper wiring 101a. The second electrode acute angle point 109 is an acute angle portion in the second electrode 106. An inter-acute angle point path 113 indicates a distance between the first electrode acute angle point 108 and the second electrode acute angle point 109. Herein, the second electrode acute angle point 109 is formed in such a way that the inter-acute angle point path 113 has a shortest distance between the first electrode 101 and the second electrode 106.

The insulating film spacer 110 is formed with the first interlayer insulating film 102 between the first electrode 101 and the variable resistance film 105. In other words, the barrier metal layer 101b of a side surface of the first electrode 101 and the variable resistance film 105 are not directly in contact with each other and are in contact with each other via the insulating film spacer 110. Therefore, the insulating film spacer 110 and the variable resistance film 105 preferably increase adhesiveness of respective interfaces. Specifically, when a main component of the variable resistance film 105 is, for example, a carbon hydride, a sulfide or the like, an oxide layer is formed on a lower layer of the variable resistance film 105 and the variable resistance film 105 is caused to have a two-layer structure, and thereby, adhesiveness of an interface between the insulating film spacer 110 and the variable resistance film 105 can be increased. In this case, the insulating film spacer 110 is in contact with the oxide layer formed on the lower layer of the variable resistance film 105. Herein, as the oxide layer, an oxide layer including, for example, zirconia, hafnia, titania, magnesia or the like is usable. Thereby, the variable resistance film 105 exhibits a function as a solid electrolyte while improving adhesiveness with the insulating film spacer 110 including silicon, oxygen and the like.

[Operation of the Variable Resistance Element 100]

Herein, an operation in which the variable resistance element 100 makes transition between a high resistance state and a low resistance state is described. Note that, in the following, in the variable resistance element 100, for example, the first electrode 101 is copper, the second electrode 106 is ruthenium, and the variable resistance film 105 is a polymer-solid electrolyte.

First, an operation (set operation) in which the variable resistance element 100 makes transition from a high resistance state (off-state) to a low resistance state (on-state) is described.

First, in the variable resistance element 100, when positive voltage is applied between the first electrode 101 and the second electrode 106 while the second electrode 106 is grounded at 0 V, an electric field is induced in an inside of the variable resistance film 105. Herein, an electric field between the first electrode 101 and the second electrode 106 is maximized at the inter-acute angle point path 113. The reason is that an intensity of an electric field is inversely proportional to a distance and therefore the inter-acute angle point path 113 is a shortest path in a path connecting the first electrode 101 and the second electrode 106. In this case, copper ions dissolved from the first electrode 101 are deposited on the inter-acute angle point path 113 and a metallic bridge is formed. Thereby, the first electrode 101 and the second electrode 106 are electrically in contact with each other via a metallic bridge made from copper ions. Therefore, the variable resistance element 100 makes transition from a high resistance state (off-state) to a low resistance state (on-state).

Next, an operation (reset operation) in which the variable resistance element 100 makes transition from a low resistance state (on-state) to a high resistance state (off-state) is described.

In this case, first, positive voltage is applied between the second electrode 106 and the first electrode 101, while in a state that the first electrode is grounded at 0 V. An amount of flowing current is proportional to an intensity of an electric field and therefore current flowing by voltage applied between the second electrode 106 and the first electrode 101 is maximized at the inter-acute angle point path 113. This accords with a position of a metallic bridge formed in an inside of the variable resistance film 105. Therefore, when positive voltage is applied between the second electrode 106 and the first electrode 101, a metallic bridge made of copper on the inter-acute angle point path 113 is partially disconnected when a predetermined threshold current (or voltage) is reached. Thereby, electric connection between the first electrode 101 and the second electrode 106 is cut off, and therefore the variable resistance element 100 makes transition from a low resistance state (on-state) to a high resistance state (off-state).

In this way, the variable resistance element 100 can execute a stable switching operation, since acute angle portions of the first electrode 101 and the second electrode 106 are provided and thereby a portion where an electric field is maximized is fixed. Further, the variable resistance element 100 can fix a portion where an electric field is maximized by including an acute angle portion, compared with a variable resistance element without any acute angle portion and therefore can execute programming (rewrite) at low voltage.

Note that, when an electric field is intended to be concentrated upon programming of any one of a set operation and a reset operation, an acute angle portion may be formed for any one of the first electrode 101 and the second electrode 106.

Therefore, in the variable resistance element 100 according to the first example embodiment of the present invention, the first electrode 101 and the second electrode 106 include acute angle portions, respectively, whereby a shortest path between the acute angle portions is uniquely determined and a formation position of a metallic bridge can be specified, and thereby a programming characteristic can be further improved.

With reference to FIG. 3, a difference in structure between the variable resistance element according to the example embodiments of the present invention and a conventional variable resistance element is described.

Figure 3A:
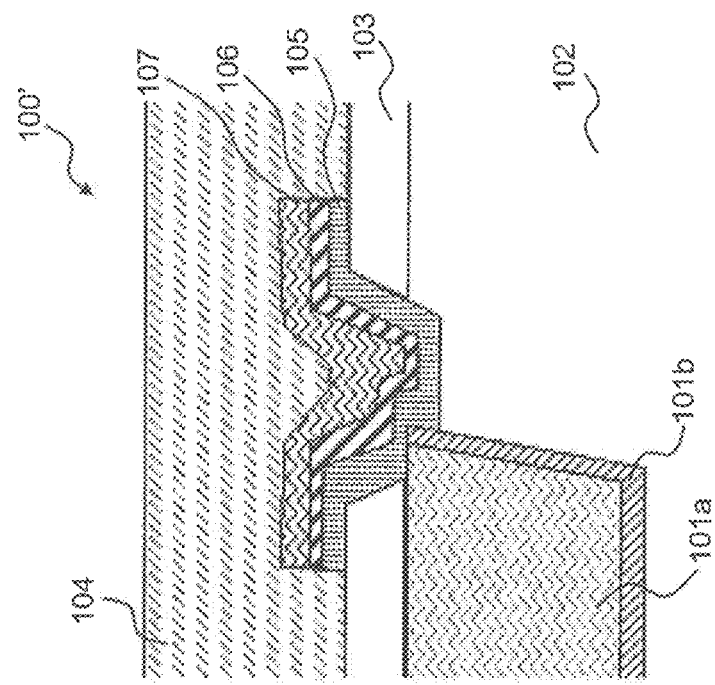
FIGS. 3A and 3B are cross-sectional views for comparing a cross-section of the variable resistance element according to the first example embodiment of the present invention and a cross-section of a conventional variable resistance element.
Figure 3B:
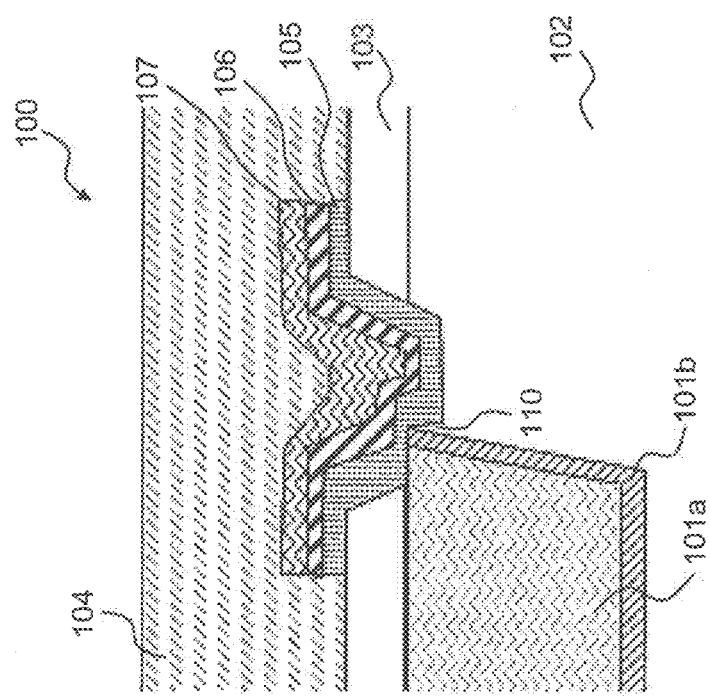

FIG. 3A illustrates an enlarged view of a cross-section of the variable resistance element 100 according to the first example embodiment of the present invention and FIG. 3B illustrates an enlarged view of a cross-section of a conventional variable resistance element 100'.

As illustrated in FIG. 3, when the variable resistance element 100 and the variable resistance element 100' are compared, in the variable resistance element 100 illustrated in FIG. 3A, the barrier metal layer 101b is in contact with the variable resistance film 105 via the insulating film spacer 110. In contrast, in the variable resistance element 100' illustrated in FIG. 3B, a barrier metal layer 101b is directly in contact with a variable resistance film 105.

In the variable resistance element 100', the variable resistance film 105 is not specifically protected, and therefore, during an off-state, there is a possibility that leakage current flows from the barrier metal layer 101b to the variable resistance film 105. In this case, it may be difficult for the variable resistance element 100' to stably make transition between a high resistance state and a low resistance state.

In contrast, the variable resistance element 100 according to the example embodiments of the present invention includes the insulating film spacer 110 between the barrier metal layer 101b and the variable resistance film 105, and therefore can protect the variable resistance film 105 from leakage current from the barrier metal layer 101b during an off-state. Therefore, the variable resistance element 100 can exhibit a stable programing characteristic, compared with the variable resistance element 100'.

[Method for Fabricating a Variable Resistance Element]

Next, a method for fabricating the variable resistance element 100 according to the example embodiments of the present invention is described.

Figure 4A:
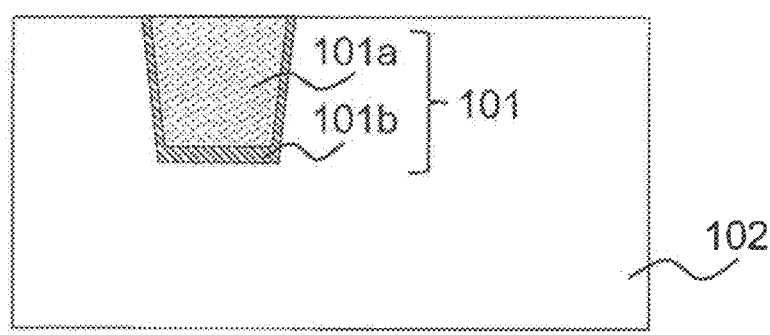
FIG. 4A is a cross-sectional view of a process schematically illustrating a method for fabricating a variable resistance element according to the first example embodiment of the present invention.
Figure 4B:
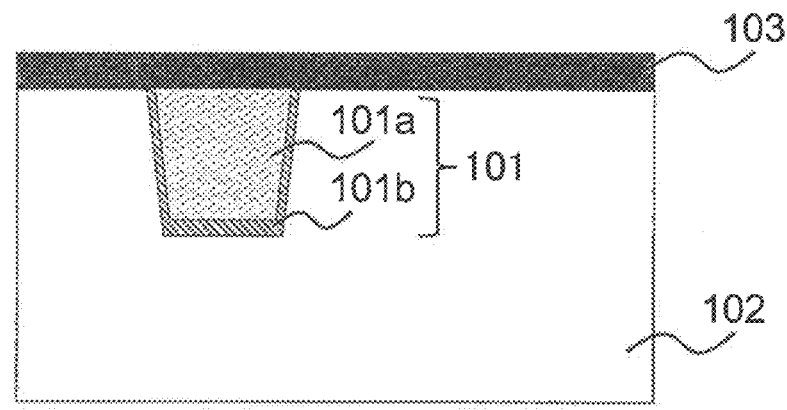
FIG. 4B is a cross-sectional view of another process schematically illustrating the method for fabricating a variable resistance element according to the first example embodiment of the present invention.
Figure 4C:
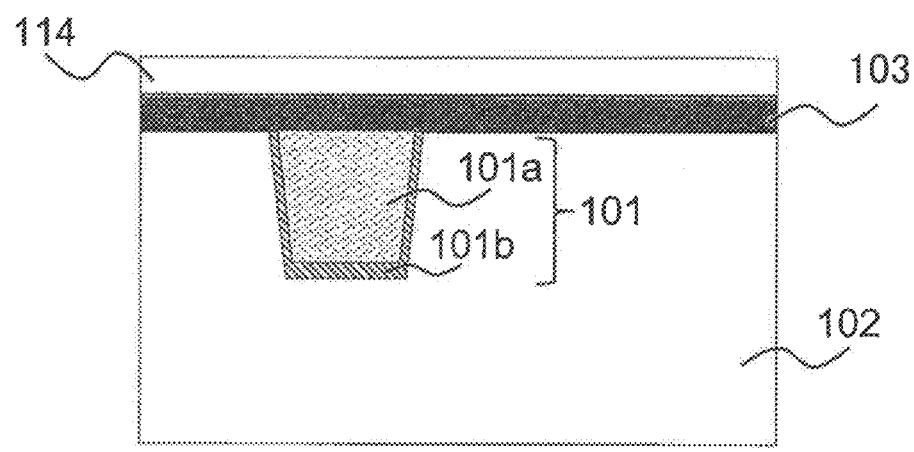
FIG. 4C is a cross-sectional view of another process schematically illustrating the method for fabricating a variable resistance element according to the first example embodiment of the present invention.

FIG. 4A to FIG. 4C are cross-sectional views of processes leading to a process for forming a hard mask film in a production process of the variable resistance element 100.

As illustrated in FIG. 4A, first, a first interlayer insulating film 102 is formed on a semiconductor substrate (not illustrated). Then, a first electrode 101 is formed in an inside of the first interlayer insulating film 102. Herein, as a method for forming the first electrode 101, with respect to the first interlayer insulating film 102, a groove for forming the first electrode 101 in the first interlayer insulating film 102 is produced, for example, by using a lithography method. Next, along with an inside of the groove, a barrier metal layer 101b is formed, and copper wiring 101a is embedded on the barrier metal layer 101b. Thereby, the first electrode 101 in which a bottom surface and a side surface of the copper wiring 101a are covered with the barrier metal layer 101b can be formed.

Next, as illustrated in FIG. 4B, an insulating barrier film 103 is formed on the first electrode 101 and the first interlayer insulating film 102. The insulating barrier film 103 can be formed, for example, by a plasma-enhanced Chemical Vapor Deposition (CVD) method.

Next, as illustrated in FIG. 4C, a hard mask film 114 is formed on the insulating barrier film 103. Herein, the hard mask film 114 is preferably a material different from the insulating barrier film 103 in order to keep an etching selection ratio large in dry etching processing. The hard mask film 114 may be an insulating film or a conductive film when being such a material.

Figure 5A:
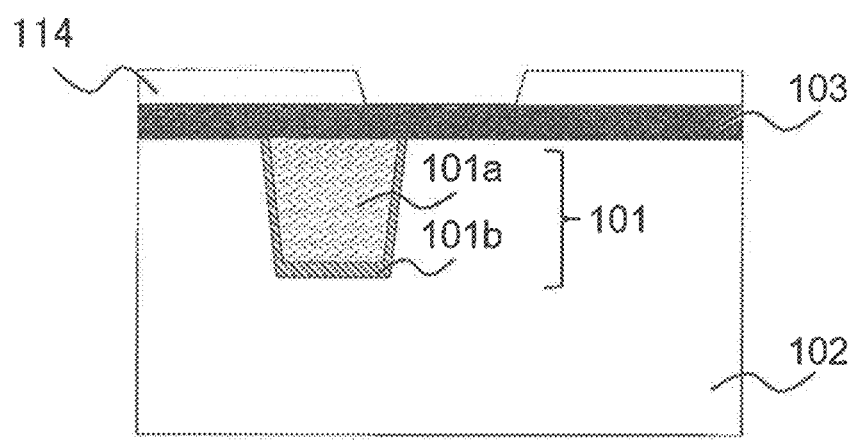
FIG. 5A is a cross-sectional view of one process schematically illustrating the method for fabricating a variable resistance element according to the first example embodiment of the present invention.
Figure 5B:
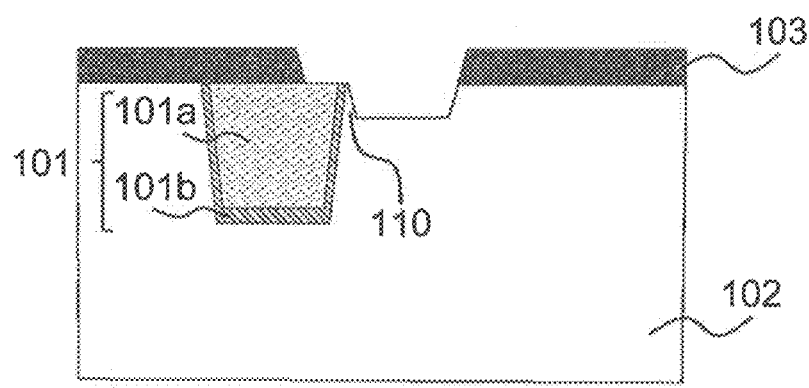
FIG. 5B is a cross-sectional view of another process schematically illustrating the method for fabricating a variable resistance element according to the first example embodiment of the present invention.
Figure 5C:
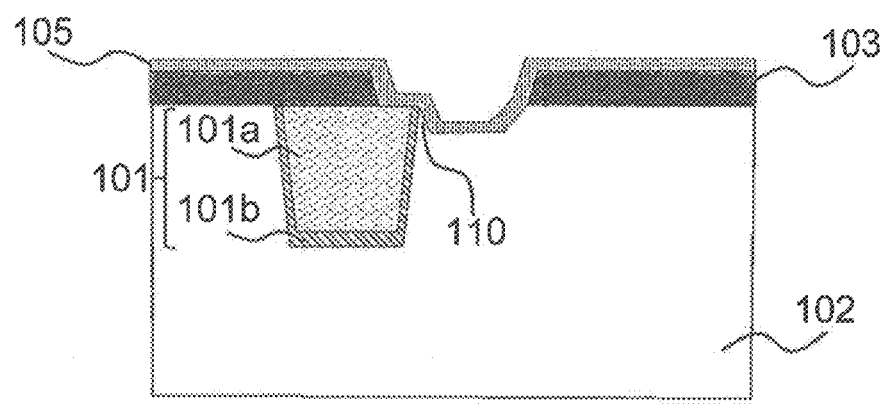
FIG. 5C is a cross-sectional view of another process schematically illustrating the method for fabricating a variable resistance element according to the first example embodiment of the present invention.

Next, with reference to FIG. 5A to FIG. 5C, a process leading to formation of a variable resistance film is described.

As illustrated in FIG. 5A, an opening is formed in the hard mask film 114. In order to form an opening in the hard mask film 114, for example, first, an opening is subjected to patterning on the hard mask film 114 by using a photoresist (not illustrated). Next, dry etching is performed using the photoresist as a mask and thereby an opening is formed on the hard mask film 114. Last, a photoresist remaining on the hard mask film 114 is peeled off, for example, by oxygen plasma ashing or the like. Note that, in FIG. 5A, an opening does not need to come to a stop on the insulating barrier film 103 and may reach an inside of the insulating barrier film 103.

Next, as illustrated in FIG. 5B, using the hard mask film 114 as a mask, the insulating barrier film 103 exposed from the opening of the hard mask film 114 is subjected to, for example, etch back (dry etching), and thereby an opening is formed in the insulating barrier film 103. The opening formed in the insulating barrier film 103 is formed into an inverse tapered shape when viewed from a vertically upper side in such a way that an upper surface of the copper wiring 101a and an upper surface of the barrier metal layer 101b are exposed. Herein, when an opening is formed in the insulating barrier film 103, reactive dry etching is used, and thereby an opening of an inverse tapered shape can be easily formed. When an opening is formed in this way, embedding characteristics of a variable resistance film 105 and a second electrode 106 can be preferably maintained in a subsequent process.

Further, when an opening is formed in the insulating barrier film 103, the opening is formed in such a way as to include an area where a first electrode 101 is not formed in the first interlayer insulating film 102. At that time, the opening of the first interlayer insulating film 102 is formed into an inverse tapered shape when viewed from a vertically upper side, similarly to the opening of the insulating barrier film 103, in such a way that a side surface of the barrier metal layer 101b is not exposed. Herein, the first interlayer insulating film 102 in contact with the barrier metal layer 101b is the insulating film spacer 110 in the first example embodiment of the present invention. Note that, in the first example embodiment of the present invention, when an opening is formed, a substrate bias of a dry etching apparatus is reduced from 300 W to 100 W, and thereby the insulating film spacer 110 can be formed to be thick. Then, copper oxide formed on exposed surfaces of the copper wiring 101a and the barrier metal layer 101b and etching byproducts and the like generated during etch back are eliminated, for example, using amine-based peeling solution or the like.

Note that, while being preferably eliminated completely when an opening is formed in the first interlayer insulating film 102 and the insulating barrier film 103, the hard mask film 114 may remain when the hard mask film 114 is made of an insulating material.

Next, as illustrated in FIG. 5C, a variable resistance film 105 is formed on the insulating barrier film 103 and along a wall surface of the opening formed in the insulating barrier film 103. The variable resistance film 105 can be formed, for example, by a Physical Vapor Deposition (PVD) method, a CVD method or the like. Further, in the first example embodiment of the present invention, as illustrated in FIG. 5C, the variable resistance film 105 is directly in contact with the insulating film spacer 110, and therefore it is desirable that adhesiveness at an interface between the variable resistance film 105 and the insulating film spacer 110 is sufficiently increased. Note that a fabrication method thereafter is similar to a fabrication method for a related variable resistance element, and therefore description is omitted.

(Comparison of Insulating Film Spacers 110)

Figure 6:
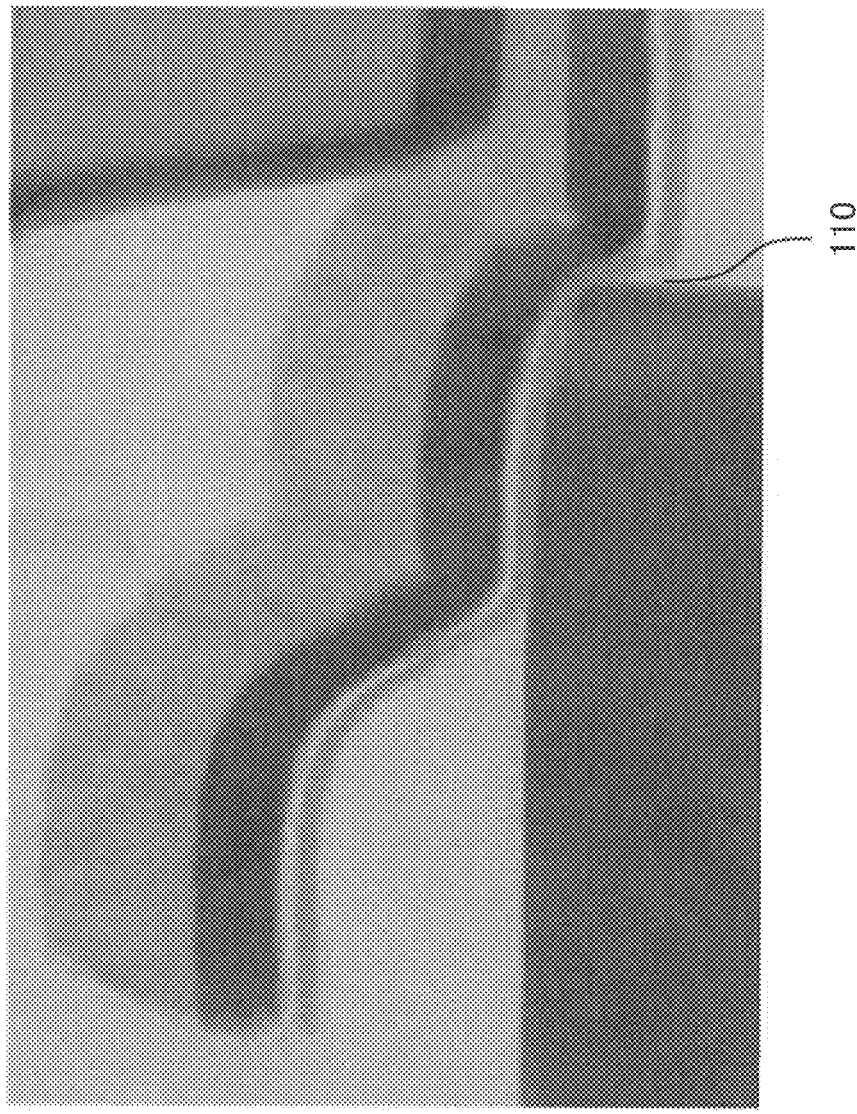
FIG. 6 is an enlarged view of an insulating film spacer according to the first example embodiment.

FIG. 6 is an enlarged view of an insulating film spacer 110 of an actually-produced variable resistance element. In the present example embodiment, a thickness of the insulating film spacer 110 can be optionally controlled through control of a dry etching process.

Figure 7A:
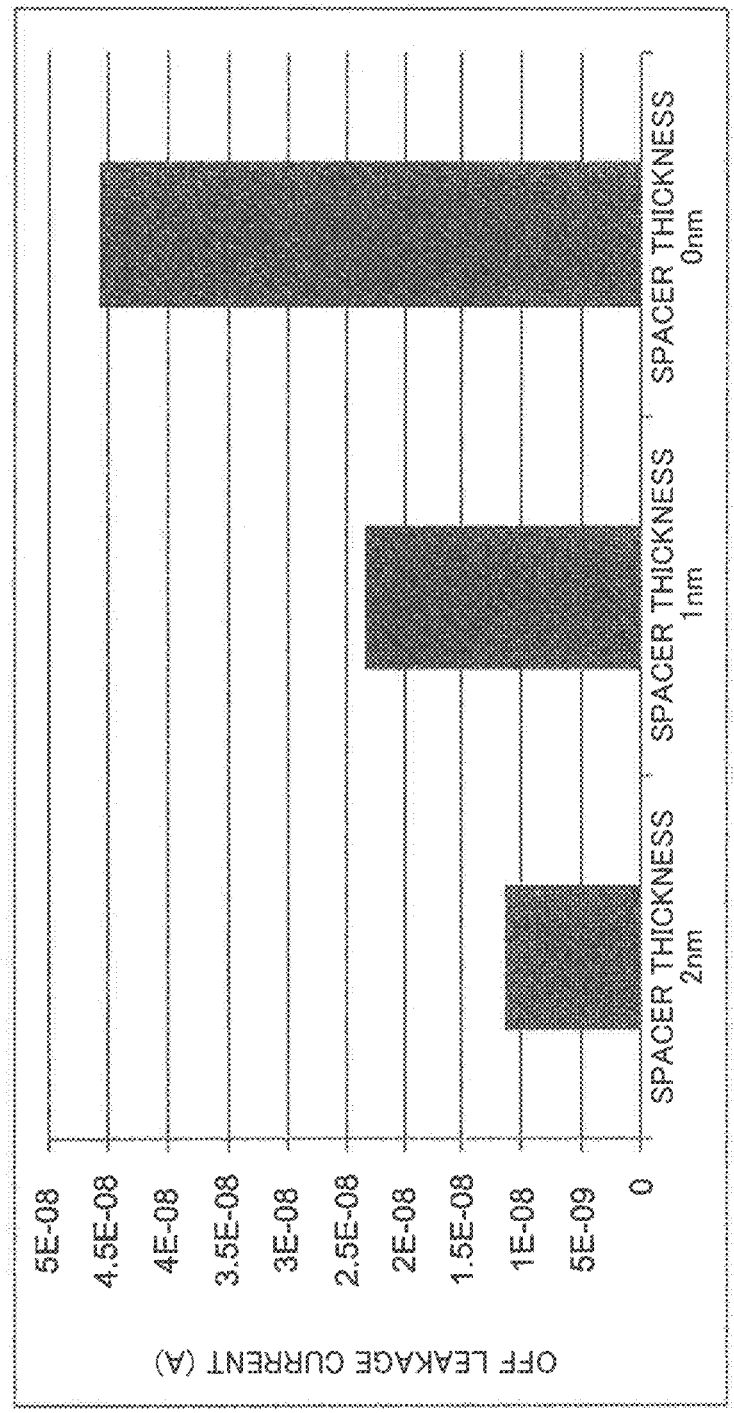
FIG. 7A is a graph illustrating a change of leakage current when a thickness of an insulating film spacer is changed.
Figure 7B:
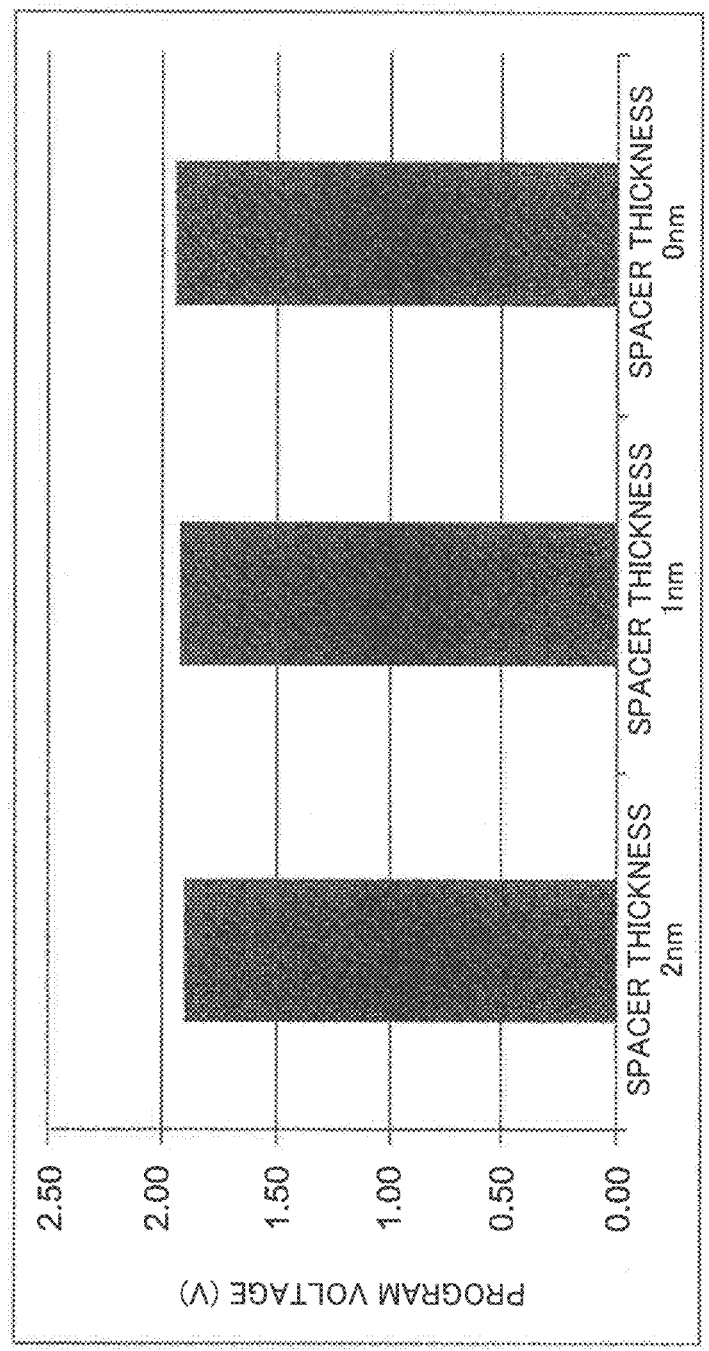
FIG. 7B is a graph illustrating a change of program voltage when a thickness of an insulating film spacer is changed.

Next, with reference to FIG. 7A and FIG. 7B, changes of characteristics of a variable resistance element when a thickness of the insulating film spacer 110 is changed are described. Herein, FIG. 7A illustrates changes of leakage current when a thickness of the insulating film spacer 110 is changed, and FIG. 7B illustrates changes of program voltage when a thickness of the insulating film spacer 110 is changed. Specifically, variable resistance elements 100 in which the insulating film spacer 110 was not inserted and thicknesses of the insulating film spacer 110 were 1 nm and 2 nm were produced and element characteristics were evaluated, respectively.

FIG. 7A indicates that leakage current in an off-state is reduced by inserting the insulating film spacer 110 between the first electrode 101 and the variable resistance film 105. The reason is that when the insulating film spacer 110 is inserted, a distance between the barrier metal layer 101b that does not contribute to switching of the variable resistance element 100 and the second electrode 106 is separated and thereby an electric field between the electrodes is reduced. In other words, when the variable resistance element 100 thickens the insulating film spacer 110 and a distance between the barrier metal layer 101b and the second electrode 106 is further separated, leakage can be further reduced.

On the other hand, FIG. 7B illustrates a relation between program voltage and a thickness of the insulating film spacer 110. As illustrated in FIG. 7B, even when a thickness of the insulating film spacer 110 is changed in the variable resistance element 100, program voltage is not substantially affected. The reason is that a spacer between the barrier metal layer 101b and the variable resistance film 105 does not contribute to switching.

Therefore, the variable resistance element 100 according to the example embodiment of the present invention can reduce leakage current while program voltage of a variable resistance element is not changed.

Second Example Embodiment

Figure 8:
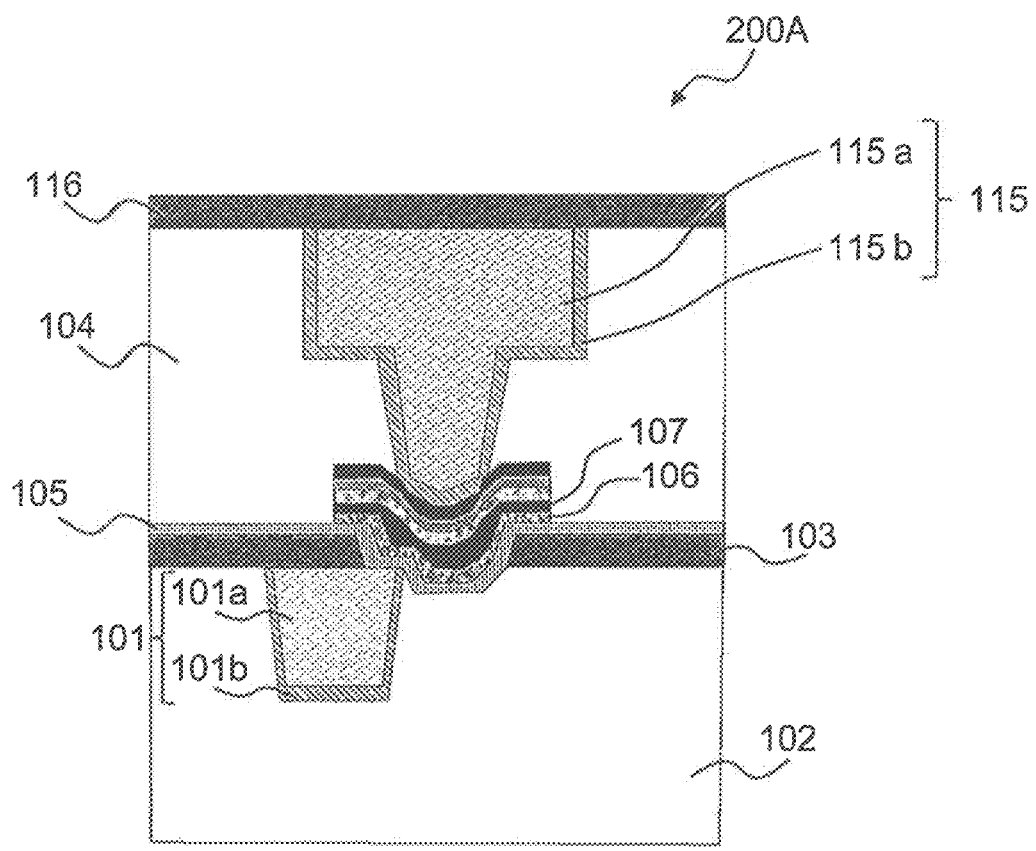
FIG. 8 is a cross-sectional view illustrating a cross-section of a semiconductor device according to a second example embodiment of the present invention.

FIG. 8 is a cross-sectional view of one example of a semiconductor device according to a second example embodiment of the present invention.

A semiconductor device 200A illustrated in FIG. 8 has a structure in which on an upper surface of the upper electrode 107 of the above-described variable resistance element 100, an insulating film or the like is provided and further a third electrode 115 is provided. Further, on an upper surface of the third electrode 115 illustrated, an insulating barrier film 116 is formed.

The third electrode 115 includes copper wiring 115a made of copper. In other words, a side surface and a bottom surface of the copper wiring 115a are covered with a barrier metal layer 115b. Herein, the barrier metal layer 115b is a conductive film that prevents copper ions from being diffused into an inside of the semiconductor device 200A. Specifically, the barrier metal layer 115b is a conductive film including, for example, a refractory metal such as Ta, TaN that is a nitride of Ta, TiN, WCN or the like. Further, the barrier metal layer 115b may be a laminated film in which a conductive films including Ta, TaN, TiN, WCN or the like is laminated.

The insulating barrier film 116 is an insulating film that prevents oxidation of the copper wiring 115a and prevents diffusion of metal ions included in the copper wiring 115a. As such an insulating barrier film 116, for example, a SiC film, a SiCN film, a SiN film or the like are usable. Further, insulating barrier film 116 may be a laminated film in which a SiC film, a SiCN film, a SiN film or the like is laminated.

As described above, the semiconductor device 200A mounts a magnetic resistance element including an insulating film spacer 110 and thereby can stabilize a programing operation.

Third Example Embodiment

Figure 9:
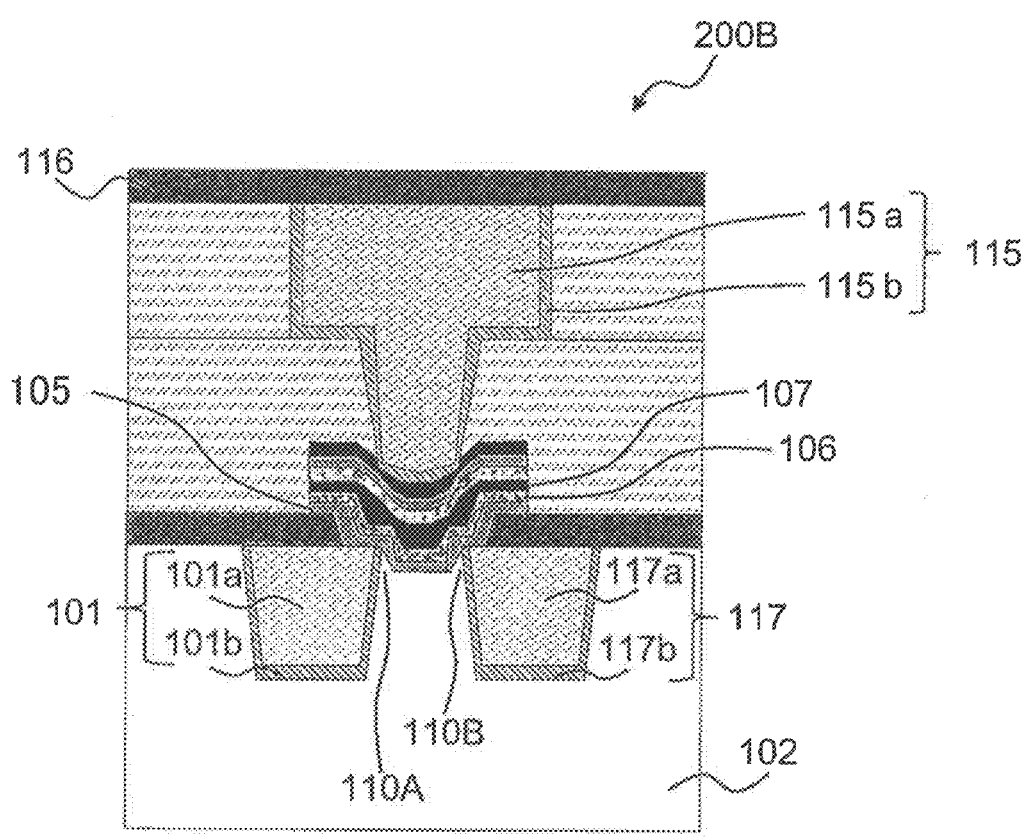
FIG. 9 is a cross-sectional view illustrating a cross-section of a semiconductor device according to a third example embodiment of the present invention.

FIG. 9 is a cross-sectional view illustrating a semiconductor device according to a third example embodiment of the present invention.

A semiconductor device 200B is a semiconductor device including a fourth electrode 117 adjacent to a first electrode 101 in an inside of an interlayer insulating film 102.

The fourth electrode 117 includes copper wiring 117a configured by copper. In other words, a side surface and a bottom surface of the copper wiring 117a are covered with a barrier metal layer 117b. Herein, the barrier metal layer 117b is a conductive film that prevents copper ions from being diffused into an inside of the semiconductor device 200B. Specifically, the barrier metal layer 117b is a conductive film including, for example, a refractory metal such as Ta, TaN that is a nitride of Ta, TiN, WCN or the like. Further, the barrier metal layer 117b may be a laminated film in which a conductive film including Ta, TaN, TiN, WCN or the like is laminated.

Further, the semiconductor device 200B includes an insulating film spacer 110A located between a barrier metal layer 101b and a variable resistance film 105 and an insulating film spacer 110B located between the barrier metal layer 117b and the variable resistance film 105. Thereby, the semiconductor device 200B not only can prevent leakage current from flowing into the first electrode 101 but also can prevent leakage current from flowing into the fourth electrode 117.

Therefore, the semiconductor device 200B can stabilize a programming operation by forming an insulating film spacer between each electrode and the variable resistance film 105, respectively, even when a plurality of electrodes are formed in an inside of the interlayer insulating film 102.

In the above-described example embodiments, as an applied example of the present invention, an apparatus technique for fabricating a semiconductor device including a Complementary Metal Oxide Semiconductor (CMOS) circuit that is an application field that is the background of the invention made by the present inventor has been described in detail, and a configuration that forms a variable resistance element in an inside of copper multilayer wiring on a semiconductor substrate has been described. However, these description does not limit the present invention.

The present invention is also applicable to a semiconductor product including a memory circuit such as a Dynamic Random Access Memory (DRAM). a Static Random Access Memory (SRAM), a flash memory, a Ferro Electric Random Access Memory (FRAM (Registered Trademark)), a Magnetic Random Access Memory (MRAM), a variable resistance-type memory, a bipolar transistor, or the like. Further, the present invention is also applicable to a semiconductor product including a logic circuit such as a microprocessor or applicable on copper wiring of a board and a package placed with these products at the same time. Further, the present invention is also applicable to junction of an electronic circuit device, an optical circuit device, a quantum circuit device, a micromachine, Micro Electro Mechanical Systems (MEMS) or the like to a semiconductor device.

Note that, while in the above-described example embodiments, a case in which the present invention is applied to a switch function has been mainly described, the present invention is also applicable to a memory element or the like using both non-volatility and variable resistance characteristics.

Further, in the variable resistance element according to the present invention, a structure can be confirmed also from a produced device. Specifically, a cross-section of a device to be observed is observed using a Transmission Electron Microscope (TEM), and thereby use of copper wiring for multi-layered wiring can be confirmed. Further, when a semiconductor device is mounted with a variable resistance element, through TEM observation, an electrode of the variable resistance element can be identified. Further, when a fact that there is a barrier metal on a side surface of an operating electrode of a semiconductor device has been confirmed through TEM observation, whether an insulating film spacer is inserted between a barrier metal and a variable resistance film or not can be confirmed.

Further, when a fabricated semiconductor device is subjected to composition analysis such as an Energy Dispersive X-ray Spectroscopy (EDX), an Electron Energy-Loss Spectroscopy (EELS), whether the fabricated semiconductor includes such material included in the present invention or not can be confirmed.

While the present invention has been described above with reference to example embodiments and examples thereof, the present invention is not limited to these example embodiments and examples. The constitution and details of the present invention can be subjected to various modifications which can be understood by those skilled in the art, without departing from the scope of the present invention. When, for example, those skilled in the art read the description of the above-described example embodiments and examples, a number of modifications and substitutions based on components and techniques equivalent to the contents included in these example embodiments and examples are made easy, but such modifications and substitutions belong to the scope of the present invention.

A part or the whole of the above-described example embodiments can be described as the following supplementary notes. Note that the following supplementary notes do not limit the present invention at all.

[Supplementary Note 1]

A variable resistance element comprising:

an interlayer insulating film;

a first electrode that is formed in an inside of the interlayer insulating film and includes an active electrode a side surface and a bottom surface of which are covered with a barrier metal;

a variable resistance film that is formed on an upper surface of the first electrode;

a second electrode that is formed on the variable resistance film; and an insulating film spacer that is formed between the barrier metal that covers a side surface of the first electrode and the variable resistance film, wherein the barrier metal that covers a side surface of the first electrode and the variable resistance film is in contact with the insulating film spacer, respectively.

[Supplementary Note 2]

The variable resistance element according to supplementary note 1, wherein the insulating film spacer is formed with the interlayer insulating film.

[Supplementary Note 3]

The variable resistance element according to supplementary note 1 or 2, wherein the insulating film spacer includes at least oxygen and silicon.

[Supplementary Note 4]

The variable resistance element according to any one of supplementary notes 1 to 3, further comprising, in an inside of the interlayer insulating film, a plurality of electrodes including the active electrode a side surface and a bottom surface of which are covered with a barrier metal, wherein the insulating film spacer is disposed between the plurality of electrodes and the variable resistance film, respectively.

[Supplementary Note 5]

The variable resistance element according to any one of supplementary notes 1 to 4, wherein a film thickness of the insulating film spacer is equal to or smaller than 10 nm.

[Supplementary Note 6]

The variable resistance element according to any one of supplementary notes 1 to 5, wherein
the first electrode includes a first acute angle portion,
the second electrode includes a second acute angle portion, and
a distance between the first acute angle portion and the second acute angle portion is a shortest distance in a distance between the first electrode and the second electrode.

[Supplementary Note 7]

The variable resistance element according to any one of supplementary notes 1 to 6, wherein
the active electrode includes copper,
the second electrode includes at least ruthenium, nitrogen, and a first metal, and
the first metal includes at least one of titanium, tantalum, aluminum, manganese, zirconium, hafnium, magnesium, cobalt, zinc, or tungsten.

[Supplementary Note 8]

The variable resistance element according to any one of supplementary notes 1 to 7, further comprising
an insulating barrier film that is formed on the first electrode and includes, in an upper surface of the first electrode, an opening that causes an end of the active electrode to be exposed, wherein
the variable resistance film is formed on an upper surface of the end.

[Supplementary Note 9]

The variable resistance element according to supplementary note 8, wherein the opening has an inverse tapered shape when viewed from a vertically upper side of the insulating barrier film.

[Supplementary Note 10]

The variable resistance element according to supplementary note 8 or 9, wherein the barrier metal that covers the end of the first electrode has a tapered shape.

[Supplementary Note 11]

The variable resistance element according to any one of supplementary notes 1 to 10, wherein
the variable resistance film is a laminated film including an oxide layer, and
the oxide layer is in contact with the insulating film spacer.

[Supplementary Note 12]

The variable resistance element according to supplementary note 11, wherein the oxide layer includes at least one of zirconia, hafnia, titania, or magnesia.

[Supplementary Note 13]

The variable resistance element according to any one of supplementary notes 1 to 12, wherein the variable resistance element is a solid electrolyte.

[Supplementary Note 14]

A method for fabricating a variable resistance element, the method comprising:
forming an interlayer insulating film;
forming a first electrode that includes an active electrode a side surface and a bottom surface of which are formed with a barrier metal layer in such a way that an upper surface is exposed to an inside of the interlayer insulating film;
forming an insulating barrier film on upper surfaces of the interlayer insulating film and the first electrode;
forming an opening that causes at least an end of the upper surface of the first electrode to be exposed to the insulating barrier film;
forming an opening in the interlayer insulating film and forming an insulating film spacer adjacent to the barrier metal layer formed on the side surface of the first electrode;
forming a variable resistance film on an upper surface of the end of the first electrode; and
forming a second electrode on the variable resistance film.

[Supplementary Note 15]

The method for fabricating a variable resistance element according to supplementary note 14, wherein the insulating film spacer is formed from the interlayer insulating film.

[Supplementary Note 16]

The method for fabricating a variable resistance element according to supplementary note 14 or 15, the method further comprising:
forming a plurality of electrodes including an active electrode a side surface and a bottom surface of which are covered with a barrier metal in an inside of the interlayer insulating film; and
forming the insulating film spacer between the plurality of electrodes and the variable resistance film, respectively.

[Supplementary Note 17]

The method for fabricating a variable resistance element according to any one of supplementary notes 14 to 16, wherein the insulating film spacer is formed such that a film thickness of the insulating film spacer is equal to or smaller than 10 nm.

[Supplementary Note 18]

The method for fabricating a variable resistance element according to any one of supplementary notes 14 to 17, the method further comprising forming an opening of the insulating barrier film and an opening of the interlayer insulating film into an inverse tapered shape when viewed from a vertically upper side.

This application is based upon and claims the benefit of priority from Japanese Patent Application No. 2016-67159, filed on Mar. 30, 2016, the disclosure of which is incorporated herein in its entirety by reference.

REFERENCE SIGNS LIST

100 Variable resistance element
101 First electrode
101a, 115a, 117a Copper wiring
101b, 115b, 117b Barrier metal layer
102 First interlayer insulating film
103, 116 Insulating barrier film
104 Second interlayer insulating film
105 Variable resistance film
106 Second electrode
107 Upper electrode
108 First electrode acute angle point
109 Second electrode acute angle point
110, 110A, 110B Insulating film spacer
111 Opening 112 Electrode shape
113 Inter-acute angle point path
114 Hard mask film
115 Third electrode
117 Fourth electrode

What is claimed is:

1. A variable resistance element comprising:
an interlayer insulating film;
a first electrode that is formed inside of the interlayer insulating film, the first electrode including an active electrode, the active electrode including a side surface and a bottom surface, both of which are covered with a barrier metal;
a variable resistance film that is formed on an upper surface of the first electrode;
a second electrode that is formed on the variable resistance film;
an insulating film spacer that is formed between the barrier metal and the variable resistance film,
an insulating barrier film including an opening wherein the barrier metal is in contact with the insulating film spacer,
the variable resistance film is elongated inside the opening of the insulating barrier film,
a lower face of the variable resistance film is in contact with a surface of the first electrode, and is otherwise in contact with a bottom of the opening of the insulating barrier film, and
a side face of the variable resistance film is in contact with a face of the insulating film spacer.

2. The variable resistance element according to claim 1, wherein the insulating film spacer is formed with the interlayer insulating film.

3. The variable resistance element according to claim 1, wherein the insulating film spacer includes at least oxygen and silicon.

4. The variable resistance element according to claim 1 further comprising, in an inside of the interlayer insulating film, a plurality of electrodes including the active electrode a side surface and a bottom surface of which are covered with a barrier metal, wherein the insulating film spacer is disposed between the plurality of electrodes and the variable resistance film, respectively.

5. The variable resistance element according to claim 1 wherein a film thickness of the insulating film spacer is equal to or smaller than 10 nm.

6. The variable resistance element according to claim 1 wherein
the first electrode includes a first acute angle portion,
the second electrode includes a second acute angle portion, and
a distance between the first acute angle portion and the second acute angle portion is a shortest distance in a distance between the first electrode and the second electrode.

7. The variable resistance element according to claim 1, wherein
the active electrode includes copper,
the second electrode includes at least ruthenium, nitrogen, and a first metal, and
the first metal includes at least one of titanium, tantalum, aluminum, manganese, zirconium, hafnium, magnesium, cobalt, zinc, or tungsten.

8. The variable resistance element according to claim 1 wherein the insulating barrier film is formed on the first electrode and the opening of the insulating barrier film is provided on an upper surface of the first electrode, the opening causing an end of the active electrode to be exposed, wherein
the variable resistance film is formed on an upper surface of the end.

9. The variable resistance element according to claim 8, wherein the opening has an inverse tapered shape when viewed from a vertically upper side of the insulating barrier film.

10. The variable resistance element according to claim 8, wherein the barrier metal that covers the end of the first electrode has a tapered shape.

11. The variable resistance element according to claim 1 wherein
the variable resistance film is a laminated film including an oxide layer, and
the oxide layer is in contact with the insulating film spacer.

12. The variable resistance element according to claim 11, wherein the oxide layer includes at least one of zirconia, hafnia, titania, or magnesia.

13. The variable resistance element according to claim 1 wherein the variable resistance film is a solid electrolyte.

* * * * *